(12) United States Patent
Fischer et al.

(10) Patent No.: US 9,562,940 B2
(45) Date of Patent: Feb. 7, 2017

(54) METHOD FOR MONITORING A HALF BRIDGE BRANCH IN A HALF BRIDGE

(71) Applicant: Robert Bosch GmbH, Stuttgart (DE)

(72) Inventors: Frank Fischer, Buehl (DE); Matthias Jacob, Rheinmuenster (DE); Georg Schulze-Icking-Konert, Buehlertal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/652,578

(22) PCT Filed: Dec. 6, 2013

(86) PCT No.: PCT/EP2013/075786
§ 371 (c)(1),
(2) Date: Jun. 16, 2015

(87) PCT Pub. No.: WO2014/095422
PCT Pub. Date: Jun. 26, 2014

(65) Prior Publication Data
US 2015/0331032 A1    Nov. 19, 2015

(30) Foreign Application Priority Data
Dec. 20, 2012 (DE) ........................ 10 2012 223 877

(51) Int. Cl.
*H02P 1/00* (2006.01)
*G01R 31/02* (2006.01)
(Continued)

(52) U.S. Cl.
CPC ............. *G01R 31/02* (2013.01); *G01R 31/006* (2013.01); *H02H 3/08* (2013.01); *H02H 7/0844* (2013.01);
(Continued)

(58) Field of Classification Search
CPC ........... H02P 6/085; H02P 29/024; H02P 6/08; H02P 6/12; H02P 6/28
See application file for complete search history.

(56) References Cited

U.S. PATENT DOCUMENTS

| | | |
|---|---|---|
| 4,369,492 A | 1/1983 | Moll et al. |
| 2007/0035976 A1 | 2/2007 | Sader |

(Continued)

FOREIGN PATENT DOCUMENTS

| | | |
|---|---|---|
| DE | 4209167 | 9/1993 |
| JP | 2002204593 A | 7/2002 |

OTHER PUBLICATIONS

International Search Report for Application No. PCT/EP2013/075786 dated Sep. 24, 2014 (English Translation, 2 pages).

*Primary Examiner* — Karen Masih
(74) *Attorney, Agent, or Firm* — Michael Best & Friedrich LLP

(57) ABSTRACT

The invention relates to a method for monitoring a half bridge branch (38) in a half bridge (32), said half bridge branch (38) being connected in series with another half bridge branch (36) in the half bridge (32) via a center tap (30), including the steps of: —applying an electric supply potential (24) opposite the center tap (30) at the other half bridge branch (36) to the center tap (30) according to a predefined time curve (50); and —monitoring the half bridge branch (38) on the basis of a comparison (70) of the predefined time curve (50) and an electrical output potential (52) at the center tap (30).

12 Claims, 2 Drawing Sheets

(51) Int. Cl.
  *G01R 31/00*    (2006.01)
  *H02H 3/08*     (2006.01)
  *H02P 27/08*    (2006.01)
  *H02H 7/122*    (2006.01)
  *H02M 1/32*     (2007.01)
  *H02H 7/08*     (2006.01)
  *H02M 7/5395*   (2006.01)

(52) U.S. Cl.
  CPC ............... *H02H 7/122* (2013.01); *H02M 1/32* (2013.01); *H02M 7/5395* (2013.01); *H02P 27/08* (2013.01); *H02H 7/1225* (2013.01)

(56) References Cited

U.S. PATENT DOCUMENTS

2009/0045763 A1    2/2009  Bay et al.
2011/0234140 A1*   9/2011  Kuroda .................... H02P 3/18
                                                    318/503

* cited by examiner

METHOD FOR MONITORING A HALF BRIDGE BRANCH IN A HALF BRIDGE

BACKGROUND OF THE INVENTION

The invention relates generally to vehicles, in particular vehicles with electric motors. The invention relates furthermore to methods for monitoring driver circuits for actuating electric motors.

The German patent publication DE 420 91 67 A1 discloses a method for monitoring a field effect transistor in a current converter in order to detect a short circuit. The short circuit is detected on the basis of a voltage drop across the field effect transistor to be monitored.

SUMMARY OF THE INVENTION

According to the invention, provision is made for a method for monitoring a half bridge branch in a half bridge as well as for a method for protecting a parallel circuit consisting of a first half bridge and at least one second half bridge, a device, a computer program, an electronic storage medium and an electric control device.

According to one aspect of the invention, a method for monitoring a half bridge branch in a half bridge, said half bridge branch being connected in series with another half bridge branch in the half bridge via a center tap, comprises the steps:

applying an electric supply potential opposite the center tap at the other half bridge branch to the center tap according to a predefined time curve; and monitoring the half bridge branch on the basis of a comparison of the predefined time curve and an electrical output potential at the center tap.

The method mentioned above is based on the consideration that, in order to perform the monitoring of the field effect transistor of the current converter, which is mentioned above with regard to the prior art and is based on a drop in voltage across said field transistor, the detection of at least two potentials is necessary in order to acquire the drop in voltage using technical measuring equipment. In order to monitor the field effect transistors in a single half bridge, at least three different electrical potentials would therefore have to be acquired. A short circuit in a field effect transistor in a half bridge can only then be suggested if the current through the field effect transistor is so large that the drop in voltage at the short-circuited field effect transistor exceeds a predefined voltage threshold. Because, however, potentially very high voltage peaks can occur particularly in current converter circuits, not only does a very high value for the voltage threshold have to be taken into account but the voltage threshold has to also be configured temporally correspondingly long, whereby the relevant other field effect transistor in the half bridge, which transistor has not yet been short-circuited, could be subjected to very high loads.

The method mentioned above is furthermore based on the consideration that a short-circuited half bridge branch in a half bridge, such as, for example, in the field effect transistor mentioned initially with regard to the prior art, either continues to apply a supply potential that is high from the standpoint of the center tap or applies a lower supply potential to the center tap of the half bridge, depending on which half bridge branch is short-circuited. Because a half bridge, on the other hand, generally assumes the task of applying the high or the low supply potential via one of the half bridge branches to the center tap according to a predefined time curve in order, for example, to generate an alternating potential as the output potential at the center tap, an error can be identified if this predefined time curve cannot be observed in the output potential at the center tap because, for example, the other half bridge branch accordingly applies the low or the high supply potential permanently as the output potential to the center tap. Within the scope of the method described above, this insight is used to reliably detect a short circuit in a half bridge branch, such as a field effect transistor, in a half bridge.

In comparison to the method mentioned initially with regard to the prior art, within the scope of which voltage drops across the half bridge branches of a half bridge are used to detect short circuits, the number of the required potentials to be acquired for the monitoring of the half bridge branches in each half bridge can be reduced to a single potential and namely the output potential at the center tap within the scope of the presently specified method. In this way, the circuit complexity for the monitoring of the half bridge branches is noticeably reduced. In addition, a short-circuit in a half bridge branch can be detected in a timely manner because a deviation of the output potential at the center tap from the predefined time curve, with which the supply potential is applied to the center tap, can only be attributed to a short circuit in the respectively other half bridge branch in the half bridge. Other reasons, such as, for example, the voltage peaks mentioned above with regard to the method initially mentioned with regard to the prior art, cannot be present.

The presently specified method therefore not only simplifies the circuit design for monitoring half bridge branches in a half bridge but short-circuits in the half bridge branches can also be detected faster, whereby the electrical loads on the still functioning half bridge branches can be noticeably reduced.

The power flow through the half bridge is not to be reduced during the procedural step of applying an electric supply potential opposite the center tap at the other half bridge branch to the center tap according to a predefined time curve. That means that an electrical current could also definitely flow from the center tap back to the supply potential.

In one embodiment of the method stated above, the predefined time curve is specified by means of a pulse width modulation. Pulse width modulation is very frequently used in particular in current converters in order to generate an alternating potential at the center tap from the supply potential at the half bridge. Alternatively, other types of modulation could, however, also be used, which are known to the person skilled in the art and which shall not be further mentioned for the sake of brevity. These other types of modulation would correspondingly specify the predefined time curve with which the supply potential is applied to the center tap.

In an additional embodiment of the method stated above, a property of the pulse width modulation is sought in order to compare the predefined time curve with the output potential. This embodiment is based on the consideration that the pulse width modulation can be determined on the basis of certain characteristic variables, which clearly characterize the pulse width modulation. For that reason, the entire time curve does not have to be constantly monitored. It is sufficient if the pulse width modulation used is clearly recognized with the aid of the characteristic variable unambiguously in the output potential at the center tap.

One or a plurality of characteristic variables of the pulse width modulation can be used as a property of the pulse width modulation. The widths of certain pulses can thus, for example, be evaluated or preferably a frequency of the pulse width modulation, which in a very preferable manner can be the modulation frequency.

In a further embodiment, the method stated above can comprise the step of counting a number of pulses in the output potential over a certain time, wherein the number of pulses is compared with a product derived from the frequency of the pulse width modulation and the predefined time in order to compare the predefined time curve with the output potential. This modification is based on the consideration that the measurement of frequencies of a signal can be carried out with the lowest measurement errors; thus enabling damage to the half bridge branch to be monitored to be reliably suggested if the number of pulses and the product derived from the frequency of the pulse width modulation and the predefined time deviate from one another.

According to a further aspect of the invention, a method for protecting a parallel circuit consisting of a first half bridge and at least one second half bridge, the center taps of which are connected to one another via an electrical component, comprises the steps:

monitoring the half bridges with one of the methods stated above, and interrupting all of the half bridge branches if the comparison of the predefined time curve with the electrical output potential meets a predefined condition.

A deviation of the predefined time curve from the electrical output potential can fall under this predefined condition.

When monitoring one of the half bridge branches in one of the half bridges, the half bridge branch in the other half bridge as seen from the center tap, which is diagonally opposite the half bridge branch to be monitored, should be constantly conductive, so that the output potential at the center tap is not distorted by this diagonally opposite center tap. It is, however, advisable in this case that the component between the two center taps produces a potential gradient so that the output potential at the center tap at the half bridge branch to be monitored is not constantly set at one of the two supply potentials.

In principle, the electrical component can be an arbitrary component. An electric motor is preferably chosen as the electrical component.

According to a further aspect of the invention, a device, in particular an arithmetic unit for monitoring a half bridge branch in a half bridge, said half bridge branch in the half bridge being connected in series via a center tap to a further half bridge branch, is equipped:

to apply an electrical supply potential opposite the center tap at the other half bridge branch to the center tap according to a predefined time curve; and to monitor the half bridge branch on the basis of a comparison of the predefined time curve and an electrical output potential at the center tap.

The specified device can be arbitrarily expanded such that it can carry out one of the specified methods according to the invention.

In a modification to the invention, the specified device has a storage and a processor. As a result, the specified method is deposited in the storage in the form of a computer program, and the processor for carrying out the program is provided if the computer program is loaded out of the storage into the processor.

According to a further aspect of the invention, a current converter, in order to supply electrical energy to an electric motor, comprises a parallel circuit consisting of a first half bridge and at least one second half bridge, the center taps of which can be connected to one another via an electric motor, and a device described above for monitoring the half bridges.

According to a further aspect of the invention, a drive device for a vehicle comprises an electric motor for moving an element of the vehicle and an aforementioned current converter. The element to be moved can be arbitrarily embodied in the vehicle, for example as a wheel, a windshield wiper or as an equipment element of a passenger compartment of the vehicle, such as, for example, an interior mirror, an exterior rear view mirror or a passenger's seat; thus enabling the drive device to be correspondingly designed as a vehicle propulsion device, a windshield wiper drive device or as an adjuster drive. In a particularly preferred manner, the drive device is designed as a power window device for moving a window of the vehicle.

According to a further aspect of the invention, a computer program is equipped to carry out all of the steps of one of the methods mentioned above.

According to a further aspect of the invention, an aforementioned computer program is stored on an electronic storage medium.

According to a further aspect of the invention, an electronic control device has an aforementioned electronic storage medium.

BRIEF DESCRIPTION OF THE DRAWINGS

Preferred embodiments of the present invention are explained below with the aid of the attached drawings. In the drawings.

DETAILED DESCRIPTION

In the figures, identical elements are provided with the same reference signs and are described only once.

Figure 1:
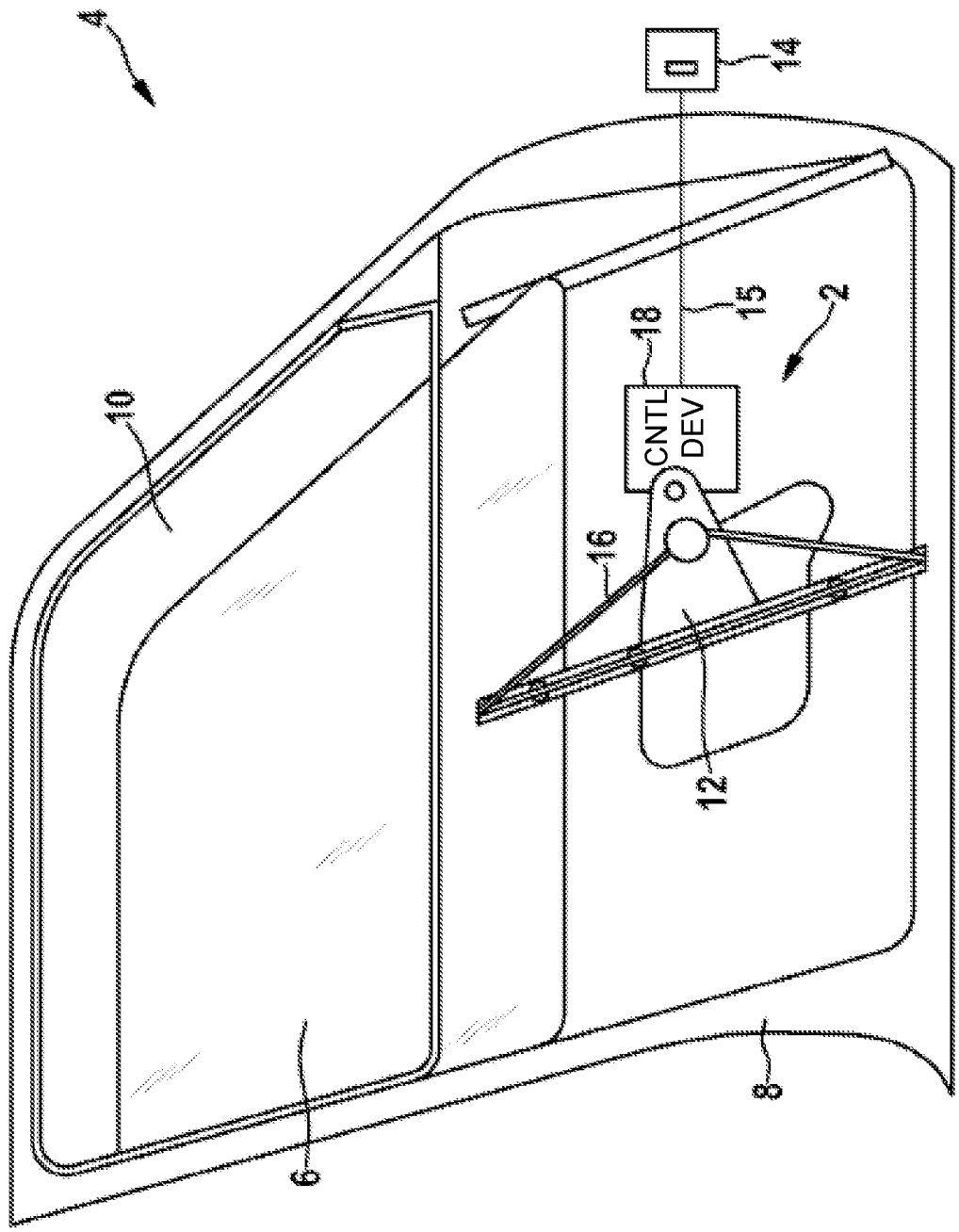
FIG. 1 shows a schematic view of a power window device.

FIG. 1 refers to a schematic view of a power window device 2 in a side door 4 of a motor vehicle which is not depicted in detail.

The power window device 2 is provided in the present embodiment to raise and lower a movable element in the form of a window pane 6 in a frame 8; thus enabling the size of a window opening 10 to be adjusted. The window pane 6 can be moved by means of an electric motor 12 which is switched on and off via an operating device 14 by means of a start signal 15. Force is transmitted from the electric motor 12 to the window pane 6 to be moved via a draw cable 16.

Figure 2:
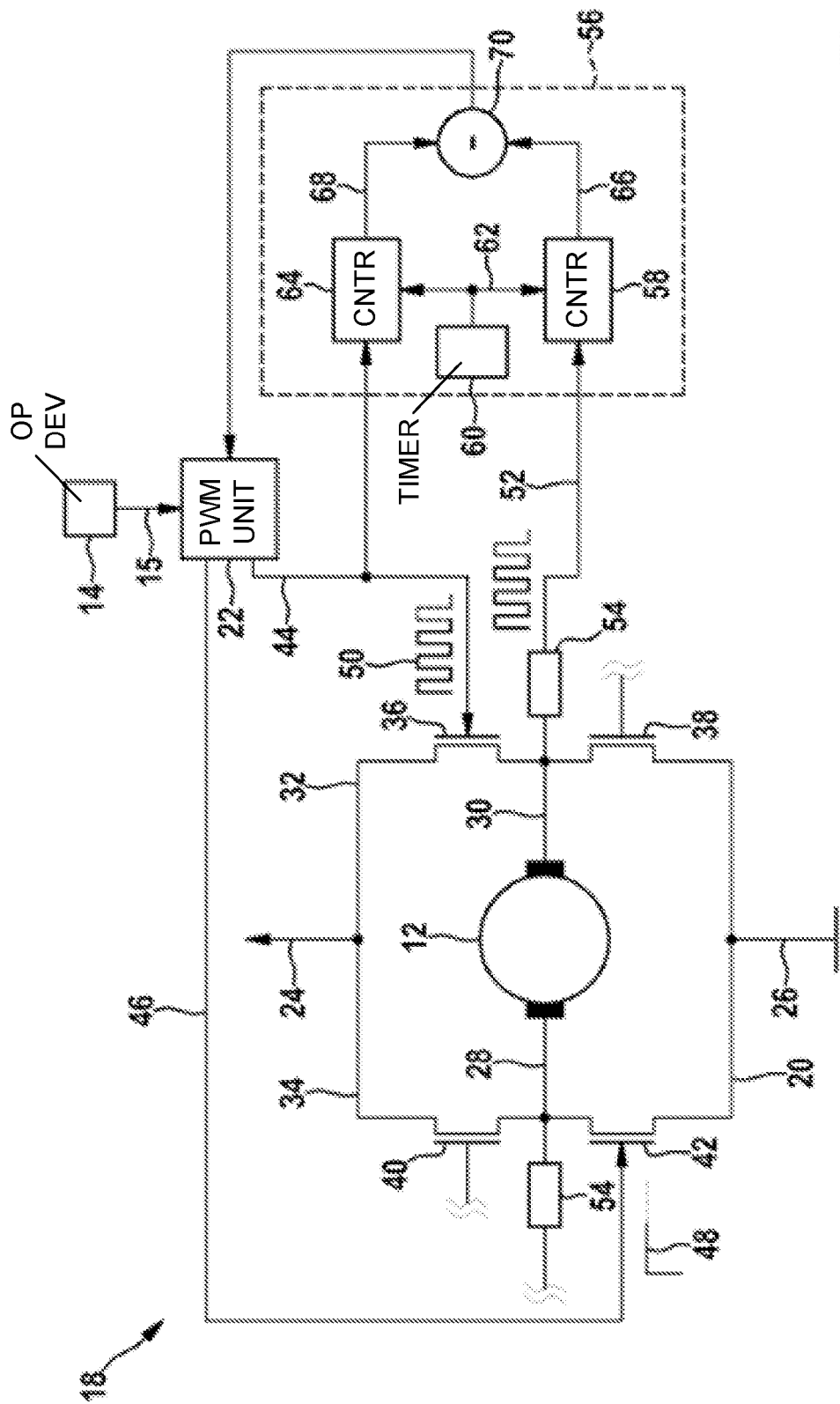
FIG. 2 shows a structural view of an electric motor of the power window device from FIG. 1 comprising an actuating device.

The electric motor 12 is thereby actuated by means of a control device 18, which shall be explained in more detail with the aid of FIG. 2.

In the present embodiment, the control device 18 comprises a current converter 20 which, actuated by means of a pulse width modulation unit 22 that is referred to below as PWM unit 22, converts DC voltage into an AC voltage in a manner known to the person skilled in the art. In so doing, the PWM unit 22 can be switched on and off by means of the operating device 14. The DC voltage, which in the present embodiment is correspondingly configured as the operating voltage 24 and as ground 26, is thereby tapped between a first supply potential 24 and a second supply potential 26. The AC voltage is tapped between the center taps 28, 30 of two half bridges 32, 34, the corresponding half bridge branches of which are designed as field effect transistors 36, 38, 40, 42 which are actuated by the PWM unit 22.

The exemplary embodiment is explained below on the basis of an actuation of the operating voltage-side field effect transistors 36 of the first half bridge and the ground-side field effect transistor 42 of the second half bridge 34 by means of the PWM unit 22. To this end, the PWM unit 22 emits a first control signal 44 to the operating voltage-side field effect transistor 36 of the first half bridge 32 and a second control signal 46 to the ground-side field effect transistor 42 of the second half bridge 34.

The second control signal 44 has a DC voltage form 48 predefined by the PWM unit 22; thus enabling the ground-side field effect transistor 42 of the second half bridge to be activated statically and the electric motor 12 to be permanently connected to the ground potential 26 via the ground-side field effect transistor 42 of the second half bridge 34.

The first control signal 44 has an AC voltage form 50 predefined by the PWM unit 22; thus enabling the operating voltage-side field effect transistor 36 of the first half bridge 32 to be cyclically switched in a manner known to the person skilled in the art in order to generate a certain output potential curve at the center tap 30 of the first half bridge 32. This certain output potential drops across the electric motor 12 and drives said electric motor, for example, in a counterclockwise rotating manner. In addition, the ground-side field effect transistor 38 of the first half bridge 32 can likewise be cyclically switched in a non-depicted manner antipodally to the operating voltage-side field effect transistor 36 of the first half bridge 32 in order to bypass an intrinsic free-wheeling diode in the operating voltage-side field effect transistor 36 of the first half bridge in a manner known to the person skilled in the art and to reduce the power loss.

If, however, the ground-side field effect transistor 38 of the first half bridge 32 is short circuited due to a defect, an output potential at the center tap 30 of the first half bridge 32 generated by means of the operating voltage-side field effect transistor 36 of the first half bridge 32 would then lead to a short-circuit current through the first half bridge 32 which could also possibly damage or even destroy the operating voltage-side field effect transistor 36 of the first half-bridge. In order to prevent this from happening, provision is made within the scope of the present embodiment for a plausibility check of the output potential at the center tap 30 of the first half bridge 32 to be performed on the basis of the first control signal 44. This ensues from the fact that the output potential at the center tap 30 of the first half bridge 32 should have the same form as the first control signal 44 when viewed over time unless said output potential is permanently connected to ground as a result of a faulty short circuit of the ground-side field effect transistor 38 of the first half bridge.

For that reason, the output potential 52 at the center tap 30 of the first half bridge 32 is conducted across a protective resistor 54 to a monitoring device 56 which counts the pulses in the output potential 52 with a first counter 58 over a time duration 62 predefined by a timer 60. The pulses in the first control signal 44 are counted over the time duration 62 by means of a second counter 64. Only if the first number of pulses 66 derived from the output potential 52 over the time duration 62 equals the second number of pulses 68 from the control signal 44 is the ground-side field effect transistor 38 of the first half bridge 32 free of short circuits. Otherwise a comparison 70 of the two number of pulses 66, 68 would lead to the difference in the number of pulses 66, 68, on the basis of which the PWM unit 22 and therefore the current converter 20 can be switched off.

If the ground-side field effect transistor 42 of the second half bridge 34 is cyclically switched instead of the operating voltage-side field effect transistor 36 of the first half bridge 32, a short circuit in the operating voltage-side field effect transistor 40 of the second half bridge 34 would then permanently connect the center tap 28 of the second half bridge 34 to the potential of the operating voltage 24 and would lead to a first number of pulses 66 which would be different from a second number of pulses 68, this time, in the second control signal 46. Thus, a short circuit could be found in each individual field effect transistor 36, 38, 40, 42, wherein the lines depicted in a broken up fashion correspondingly represent necessary control lines to the PWM unit 22 and measurement lines to the monitoring device 56, which have not been completely delineated for the sake of clarity.

The present exemplary embodiment was described with the aid of a two-phase inverter as a current converter 20. Said embodiment can, however, easily be expanded to include any multi-phase current converter.

The invention claimed is:

1. A method for monitoring a half bridge branch (38) in a half bridge (32), said half bridge branch being connected in series with another half bridge branch (36) in the half bridge (32) via a center tap (30), a PWM unit (22) which outputs a first control signal (44) to the further half bridge branch (36) of the half bridge (32), and a monitoring device (56) including a first counter (58), a second counter (64), and a timer (60), the method comprising:
applying an electric supply potential (24) opposite the center tap (30) at the other half bridge branch (36) to the center tap (30) according to a predefined time curve (50);
counting, by the first counter (58) pulses of an electric output potential (52) at the center tap (30) over a time period (62);
counting, by the second counter (64) pulses of the first control signal (44) over the time period (62); and
monitoring the half bridge branch (38) on the basis of a comparison (70) of the predefined time curve (50) and the electrical output potential (52) at the center tap (30).

2. The method according to claim 1, wherein the predefined time curve (50) is predefined by a pulse width modulation.

3. The method according to claim 2, wherein a property of the pulse width modulation in the output potential (52) is used to compare (70) the predefined time curve (50) with the output potential (52).

4. The method according to claim 3, wherein the property of the pulse width modulation is a frequency of the pulse width modulation.

5. The method according to claim 4, further comprising counting a number (66) of pulses in the output potential (52) over a predefined time (62), wherein the number of pulses (66) is compared with a product (68) of the frequency of the pulse width modulation and the predefined time (62) in order to compare (70) the predefined time curve (50) with the output potential (52).

6. A method for protecting a parallel circuit (20) comprising a first half bridge (32) and at least one second half bridge (34), the center taps (28, 30) of which are connected to one another via an electrical component, the method comprising:
monitoring the half bridges (32, 34) with a method according to claim 1, and interrupting all of the half bridge branches (36, 38, 40, 42) if the comparison of the predefined time curve (50) with the electrical output potential (52) meets a certain condition.

7. The method according to claim 1, wherein the steps of the method are carried out by a computer program.

8. A non-transitory electronic storage medium, on which the computer program according to claim 7 is stored.

9. An electronic control device which has an electronic storage medium according to claim 8.

10. A device (56), for monitoring a half bridge branch (38) in a half bridge (32), said half bridge branch in the half bridge (38) being connected in series via a center tap (30) to a further half bridge branch (36), a PWM unit (22) outputting a first control signal (44) to the further half bridge branch (36) of the half bridge (32), the device (56) being configured
- to apply an electrical supply potential (24) opposite the center tap (30) at the other half bridge branch (36) to the center tap (30) according to a predefined time curve (50);
- to count pulses of an electric output potential (52) at the center tap (30) over a time period (62);
- to count pulses of the first control signal (44) over the time period (62); and
- to monitor the half bridge branch (38) on the basis of a comparison (70) of the predefined time curve (50) and an electrical output potential (52) at the center tap (30).

11. The device (56) according to claim 10, wherein the device (56) is an arithmetic unit.

12. A current converter (20) for supplying electrical energy to an electric motor (12), the current converter (20) comprising:
- a parallel circuit comprising a first half bridge (32) and at least one second half bridge (34), the center taps (28, 30) of which are connected to one another via the electric motor (12), and
- a device (56) according to claim 10 for monitoring the half bridges (32, 34).

* * * * *